United States Patent
Storms et al.

(10) Patent No.: US 8,275,794 B2
(45) Date of Patent: Sep. 25, 2012

(54) LIGHTWEIGHT SELF-CONTAINED SELF-EXPANDING PRODUCT DATA PACKAGE

(75) Inventors: Craig Storms, Weare, NH (US); Soren Abildgaard, Hopkinton, NH (US)

(73) Assignee: Autodesk, Inc., San Rafael, CA (US)

( * ) Notice: Subject to any disclaimer, the term of this patent is extended or adjusted under 35 U.S.C. 154(b) by 2529 days.

(21) Appl. No.: 10/038,071

(22) Filed: Jan. 4, 2002

(65) Prior Publication Data

US 2003/0144979 A1    Jul. 31, 2003

(51) Int. Cl.
*G06F 7/00* (2006.01)
*G06F 17/30* (2006.01)
(52) U.S. Cl. ......... 707/793; 707/796; 707/803; 707/804
(58) Field of Classification Search ............... 707/104.1, 707/3, 4, 10, 101, 102, 793, 796, 803, 804
See application file for complete search history.

(56) References Cited

U.S. PATENT DOCUMENTS

| | | | | |
|---|---|---|---|---|
| 5,515,269 A | * | 5/1996 | Willis et al. ..................... | 705/29 |
| 6,128,600 A | * | 10/2000 | Imamura et al. ................. | 705/27 |
| 6,434,623 B1 | * | 8/2002 | Sasaki et al. .................... | 709/232 |
| 6,480,124 B2 | * | 11/2002 | Shiba .............................. | 341/50 |
| 6,591,272 B1 | * | 7/2003 | Williams ........................ | 707/102 |
| 6,625,619 B1 | * | 9/2003 | McClendon et al. ......... | 707/104.1 |
| 6,635,088 B1 | * | 10/2003 | Hind et al. ..................... | 715/513 |
| 2002/0107761 A1 | * | 8/2002 | Kark et al. ...................... | 705/27 |
| 2002/0156694 A1 | * | 10/2002 | Christensen et al. ........... | 705/26 |

OTHER PUBLICATIONS

S. Ceri et al., Comples Queries in XML-GL, 2000, ACM, pp. 888-893.*

Kevin Williams, "XML for Data: An early look at XQuery", Feb. 1, 2002, IBM, pp. 1-5.*

* cited by examiner

*Primary Examiner* — Vincent Boccio
(74) *Attorney, Agent, or Firm* — Gates & Cooper LLP

(57) ABSTRACT

One or more embodiments of the invention provide a data structure, method, apparatus, and article of manufacture for representing data in a self-expanding data package. The package comprises one or more basic table data having zero, one or more table rows, a set of one or more constant lists having one or more values, and one or more row validation calculations. Use of the set of constant lists and row validation calculations provides a mechanism for compact data storage, wherein the self-expanding data package may be expanded. To expand the package, each list member of a constant list is combined with all other basic table rows and additional list members to produce every possible combination of table rows. Row validation calculations are applied to test validity of each tow, and only those expanded table tows that are valid appear in the expanded table.

89 Claims, 6 Drawing Sheets

LIGHTWEIGHT SELF-CONTAINED SELF-EXPANDING PRODUCT DATA PACKAGE

BACKGROUND OF THE INVENTION

1. Field of the Invention

The present invention relates generally to representing data in one or more tables, and in particular, to a method, apparatus, and article of manufacture for representing large table structures in a small self-contained data package.

2. Description of the Related Art

Part catalogs are well known in the art. A broad range of manufactured parts are required and frequently re-used by a variety of professions covering Design, Procurement, Construction, and Maintenance in industries such as architectural, electrical, and mechanical. Software applications utilizing product data include CAD and non-CAD solutions to assist professionals throughout a project development and maintenance life cycle. Product data is required across the range of applications and therefore it is important to easily transfer complete product definitions between applications. Products may often be designed with a wide range of sizes and features resulting in millions and in some cases billions of product variations for a single part. A data structure or table containing all of the parts may grow excessive in size and be cumbersome to manipulate, consuming considerable memory. Further, transporting such a large table is slow and inefficient.

For example, in the heating, ventilation, and air conditioning (HVAC) industry, it is a common practice to manufacture duct fittings that occur in a wide range of sizes. A simple rectangular transition tee fitting is often manufactured in a very wide range of sizes for each duct connection with variables such as material and thickness.

FIG. 1 illustrates an example of a rectangular duct tee that may use sizes from 2" to 48" for each of the duct connection size parameters. If increments are restricted to 2", this modest example yields 24 values for RH1, 24 values for RW1, etc. In addition, a list of 5 materials and 10 gauge values (gauge=thickness of sheet metal) may be added for further part variation. If all combinations are allowed, the total number of part variations may be calculated as #RH1×#RW1× #RH2×#RW2×#RH3×#RW3×#Mats×#Gauges. Accordingly, the part count is 24×24×24×24×24×24×5×10, for a total of 9,555,148,800 part variations.

Storing such a large number of part variations consumes memory, is complex, and inefficient for storage and transfer. Accordingly, what is needed is a lightweight, self-contained, self-expanding data package.

SUMMARY OF THE INVENTION

One or more embodiments of the invention provide a data structure, method, apparatus, and article of manufacture for representing data in a self-expanding data package. The data package contains a set of one or more constant lists and one or more calculations. Each element in each constant list is combined with each element in all other constant lists in all possible combinations. Additionally, the data package may contain a basic table. When a basic table is used, each row of the basic table is combined with each element in each constant list in all possible combinations.

The combinations of the basic table and constant lists produce an expanded table. The calculations are then used to add additional data to each row, eliminate a duplicate row, test the validity of a table row, and/or as a precursor test to use in another calculation. Accordingly, a large expanded table may be produced from a relatively small package of data. Thus, the invention provides for a lightweight, self-contained, self-expanding data package.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Overview

Data is represented in a self-expanding data package using a basic table, a set of one or more constant lists, and one or more calculations. To expand the package, each row of the basic table is combined with each element in each constant list in all combinations. Thereafter, the calculations can be used in another calculation, or may produce additional data, validate a row, and/or eliminate a duplicative row.

Hardware Environment

Figure 2:
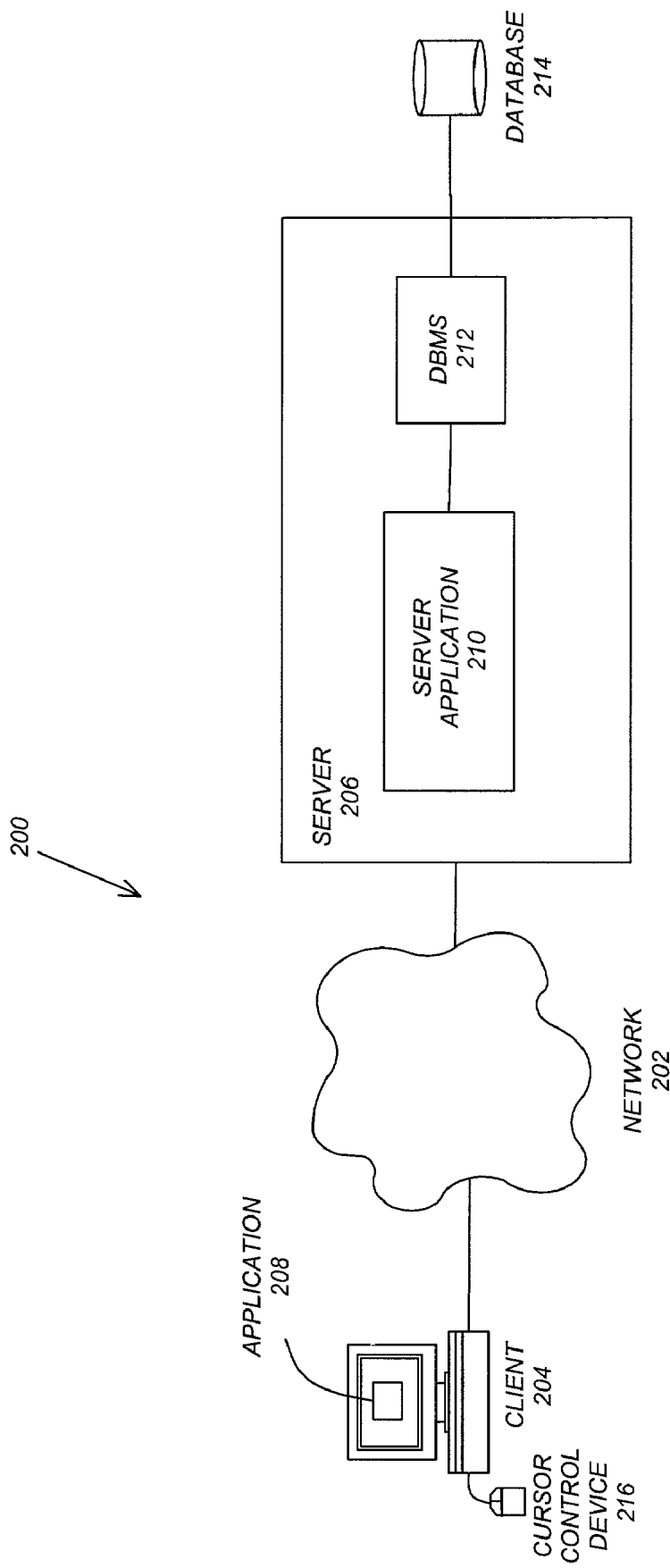
FIG. 2 schematically illustrates a hardware and software environment in accordance with one or more embodiments of the invention.

FIG. 2 schematically illustrates a hardware and software environment in accordance with one or more embodiments of the invention, and more particularly, illustrates a typical distributed computer system 200 using a network 202 to connect client computers 204 to server computers 206. A typical combination of resources may include a network 202 comprising the Internet, LANs, WANs, SNA networks, or the like, clients 204 that are personal computers or workstations, and servers 206 that are personal computers, workstations, minicomputers, or mainframes. Additionally, both client 204 and server 206 may receive input (e.g., cursor location input) and display a cursor in response to an input device such as cursor control device 216.

A network 202 such as the Internet connects clients 204 to server computers 206. Clients 204 may execute a client application 208 and communicate with server computers 206 executing a server application 210. Such an application 208 is typically a drawing program such as a CAD or solid modeling program (e.g., AUTOCAD or INVENTOR, both of which are available from the present assignee of the current invention, Autodesk, Inc.).

Server Application 210 is configured to respond to requests by client 204 for data and other information. Server application 210 may also be configured to control access to information to client 204. Additionally, server application may manipulate and control data in database 214 through a database management system (DBMS) 212. Alternatively, database 214 may be part of or connected directly to client 204 instead of communicating/obtaining the information from database 214 across network 202.

Generally, these components 208-216 all comprise logic and/or data that is embodied in or retrievable from device, medium, signal, or carrier, e.g., a data storage device, a data communications device, a remote computer or device coupled to the computer via a network or via another data communications device, etc. Moreover, this logic and/or data, when read, executed, and/or interpreted, results in the steps necessary to implement and/or use the present invention being performed.

Thus, embodiments of the invention may be implemented as a method, apparatus, or article of manufacture using standard programming and/or engineering techniques to produce software, firmware, hardware, or any combination thereof. The term "article of manufacture" (or alternatively, "computer program product") as used herein is intended to encompass logic and/or data accessible from any computer-readable device, carrier, or media.

Those skilled in the art will recognize many modifications may be made to this exemplary environment without departing from the scope of the present invention. For example, those skilled in the art will recognize that any combination of the above components, or any number of different components, including different logic, data, different peripherals, and different devices, may be used to implement the present invention, so long as similar functions are performed thereby.

Self-Expanding Data Package

A client application 208 or server application 210 of the present invention is configured to obtain, represent, or control data in a lightweight self-contained, self-expanding data package. The data package is fully self-contained and may be expanded into a standard data table (referred to as an expanded table) with a fixed number of columns and rows.

The self-expanding data package is lightweight in that the package is a very compact data structure, readily transported over a network 202. Additionally, the self-expanding data package is self-contained in that no external dependencies (e.g., table or database) are required to interpret the data. Further, the self-expanding data package is self-expanding in that the logic for expanding the table is fully defined in the package and its data.

The self-expanding data package is well suited to describing product data occurring in a wide range of sizes and product features, but can, in principle, be used in any scenario where a data table might be used. For example, the self-expanding data package may comprise product data for use in a computer-aided design application. Further, a maximum benefit is seen in cases where values are repeated and the logic for combining values can be defined as business rules.

Figure 1:
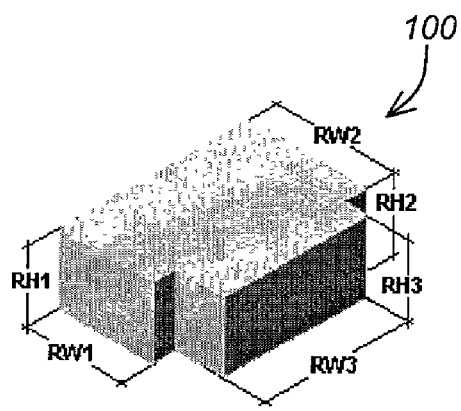
FIG. 1 illustrates an example of a rectangular duct tee that may use sizes from 2" to 48" for each of the duct connection size parameters.

Referring again to FIG. 1, as stated above, if no rules are applied, and all combinations are allowed, the total number of part variations yields approximately 10 million product variations. In practice not all of the part variations may be useful. Accordingly, business rules may be used to eliminate unwanted combinations.

For example very light gauge metal may not be used if a dimension exceeds a certain size. Also, some of the parts may in fact be duplicates because of the symmetry of the tee 100. By applying rules to how the data is combined, unwanted product variations may be eliminated.

Applications may either fully expand the compact data structure or, in cases where very large expanded tables would result, the tables may be partially expanded by applying a filter (applying specific query conditions). In either case, the result is an "expanded table", which is a normalized data table readily used by a wide range of applications.

Package Structure

The self-expanding data package may combine usage of optional "basic table" data with a set of "constant lists" and "calculations". Together, these define the raw data in a compact form with business rules for expanding the resultant table.

Use of constant lists and calculations provides the mechanism for compact data storage. For each list of values, every list member is combined with all other basic table rows and additional list members to produce every possible combination. Once each combination is constructed, the calculations are applied to test the validity of the expanded table tow. Only those that match the defined business rules (within the calculation) are added to the expanded table result.

Any particular part family may be stored in the package in a variety of ways. The data publisher must make decisions regarding the optimal use of the table. In principle all data could be stored in the basic table data structure, but this may not provide any benefit of compact data storage. Such a verbose approach would create very large data packages. In most cases where a wide range of part sizes (or part variations) occur within a part family, use of constant lists coupled to validation calculations enables compact data storage. Thus, although a basic table may be used, embodiments of the invention may solely rely on the use of constant lists and calculations.

In extreme cases where numerous lists may be used to describe attributes of the part, very compact data packages result.

The data package may be represented or programmed in a variety of manners. In one or more embodiments, the data package is written in extensible markup language (XML). XML provides an easy to read data format and is a data modeling language useful in providing sample data. The data package itself can be applied in a variety of ways and is not limited to XML. Additionally, an XML schema may be utilized to allow for table storage, supported calculations, constant lists, conditional calculations, parameter contexts, parameter indexing (for groups of parameters), and/or the concept of an expanded table.

Basic Table

The basic table provides an underlying structure for the data. Each column of the table contains a fixed number of row elements to store the values in each column. Use of this data structure should be minimized to optimize data storage. Thus, a predefined set of rows, with each row defining a unique data set (e.g., a product) may be stored in a basic table. The basic table may be empty.

Constant Lists

The constant lists provide a number of values that are combined with the basic table structure and values in other constant lists. Any value found in a constant list item can be combined with any combination of values from all remaining parameters (i.e., other constants or calculations). Any number of constant lists may be used in the data package.

Calculations

Calculations are used to operate on the constants and the basic table data to perform a variety of functions. The different calculations may be distinguishable by the context in which they are used. For example, a calculation that is used in the context of validating a particular row of table data (e.g., a particular product) is considered a validation calculation. Part variations (typically size variations, but may also be material, gauge, or other non-size attributes) may be validated using a validation calculation. A result of TRUE implies the result is to be added to the expanded table. Calculations may also be used in the context of performing precursor conditional tests (e.g., that is then used in a validation calculation), or to provide additional data used in the resulting expanded table. Further, the calculated data applies to all expanded rows.

Example Implementations

Simple Conceptual Sample

The following example applies the basic table and constant list concepts used by the data package and illustrates how a resulting expanded table is constructed. The overly simplified sample product is a snow-blower.

The basic table in this example, BASIC TABLE A, contains three columns "Engine Style", "Engine Size", and "Power Rating" each with 3 rows.

| BASIC TABLE A | | |
|---|---|---|
| Engine Style | Engine Size | Power Rating |
| 2AGX-05HP | 0.5 Liter | 5 HP |
| 2AGX-08HP | 1.0 Liter | 8 HP |
| 2AGX-10HP | 1.5 Liter | 10 HP |

Three constant lists, "Start Mechanism" (CONSTANT LIST 1), "Scoop Height" (CONSTANT LIST 2), and "Body Color" (CONSTANT LIST 3), are also used in this example.

| CONSTANT LIST 1 |
|---|
| Start Mechanism |
| Pull Start |
| Electric-Battery |
| Electric-Plug in |

| CONSTANT LIST 2 |
|---|
| Scoop Height |
| 14" |
| 18" |
| 24" |

| CONSTANT LIST 3 |
|---|
| Body Color |
| Red |
| Green |
| Beige |

In addition to the basic table and three constant lists, a validation calculation is used: the "snow height" clearance depends on "engine power" such that if "engine power" is less than 8 HP, a "scoop height" greater than 14" may not be used.

The following XML may be used to represent the basic table, three constant lists, and validation calculation.

```
<?xml version="1.0"?>
<pPackage desc="Product Package Sample">
    <Column name ="EngineStyle" dataType="string">
        <Row id="r0">2AGX-05HP</Row>
        <Row id="r1">2AGX-08HP</Row>
        <Row id="r2">2AGX-10HP</Row>
    </Column>
    <Column name ="EngineSize" dataType="float" unit="Liter">
        <Row id="r0">0.50</Row>
        <Row id="r1">1.00</Row>
        <Row id="r2">1.50</Row>
    </Column>
    <Column name ="PowerRating" dataType="float" unit="HP">
        <Row id="r0">5.0</Row>
        <Row id="r1">8.0</Row>
        <Row id="r2">10.0</Row>
    </Column>
    <ConstantList name="StartMechanism" dataType="string">
        <Item id="i0">Pull</Item>
        <Item id="i1">Battery</Item>
        <Item id="i2">Plug-in</Item>
    </ConstantList>
    <ConstantList name="ScoopHeight" dataType="float" unit="inch">
        <Item id="i0">14.00</Item>
        <Item id="i1">18.00</Item>
        <Item id="i2">24.00</Item>
    </ConstantList>
    <ConstantList name="Color" dataType="string">
        <Item id="i0">Red</Item>
        <Item id="i1">Green</Item>
        <Item id="i2">Beige</Item>
    </ConstantList>
    <Calculation desc="Conditional Test 1 Engine less than 8 HP" dataType="bool"
name="CT1"
        context="Conditional_Test">$PowerRating < 8</Calculation>
    <Calculation desc="Conditional Test 2 Scoop greater than 14" dataType="bool"
name="CT2"
        context="Conditional_Test">$ScoopHeight > 14</Calculation>
    <Calculation desc="Validation Test 1 Large Gauge Rule" dataType="bool"
```

```
        name="VT1"
           context="PartSizeValidation_Test">1 − ($CT3*$CT4)</Calculation>
      <Calculation desc="Part Name" dataType="string" name="Name"
           context="Catalog_PartSizeName">FormatNumber($PowerRating,0) + " HP " +
           "$Color $ScoopHeight inch max height $StartMechanism Start Snow
Blower"</Calculation>
   </pPackage>
```

The summary table below (SUMMARY TABLE A) shows the result of fully expanding the sample data package. As illustrated, the table contains 63 part variations of the possible 81 (18 part variations were removed by the validation rule).

SUMMARY TABLE A

| Part Name | Engine Style | Engine Size | Power Rating | Scoop Ht. | Start Mech. | Color |
|---|---|---|---|---|---|---|
| 5 HP Red 14" max height Pull Start Snow Blower | 2AGX-05HP | 0.5 Liter | 5 HP | 14" | Pull | Red |
| 8 HP Red 14" max height Pull Start Snow Blower | 2AGX-08HP | 1.0 Liter | 8 HP | 14" | Pull | Red |
| 10 HP Red 14" max height Pull Start Snow Blower | 2AGX-10HP | 1.5 Liter | 10 HP | 14" | Pull | Red |
| 8 HP Red 18" max height Pull Start Snow Blower | 2AGX-08HP | 1.0 Liter | 8 HP | 18" | Pull | Red |
| 10 HP Red 18" max height Pull Start Snow Blower | 2AGX-10HP | 1.5 Liter | 10 HP | 18" | Pull | Red |
| 8 HP Red 24" max height Pull Start Snow Blower | 2AGX-08HP | 1.0 Liter | 8 HP | 24" | Pull | Red |
| 10 HP Red 24" max height Pull Start Snow Blower | 2AGX-10HP | 1.5 Liter | 10 HP | 24" | Pull | Red |
| 5 HP Red 14" max height Battery Start Snow Blower | 2AGX-05HP | 0.5 Liter | 5 HP | 14" | Battery | Red |
| 8 HP Red 14" max height Battery Start Snow Blower | 2AGX-08HP | 1.0 Liter | 8 HP | 14" | Battery | Red |
| 10 HP Red 14" max height Battery Start Snow Blower | 2AGX-10HP | 1.5 Liter | 10 HP | 14" | Battery | Red |
| 8 HP Red 14" max height Battery Start Snow Blower | 2AGX-08HP | 1.0 Liter | 8 HP | 18" | Battery | Red |
| 10 HP Red 14" max height Battery Start Snow Blower | 2AGX-10HP | 1.5 Liter | 10 HP | 18" | Battery | Red |
| 8 HP Red 14" max height Battery Start Snow Blower | 2AGX-08HP | 1.0 Liter | 8 HP | 24" | Battery | Red |
| 10 HP Red 14" max height Battery Start Snow Blower | 2AGX-10HP | 1.5 Liter | 10 HP | 24" | Battery | Red |
| 5 HP Red 14" max height Plug-in Start Snow Blower | 2AGX-05HP | 0.5 Liter | 5 HP | 14" | Plug-in | Red |
| 8 HP Red 14" max height Plug-in Start Snow Blower | 2AGX-08HP | 1.0 Liter | 8 HP | 14" | Plug-in | Red |
| 10 HP Red 14" max height Plug-in Start Snow Blower | 2AGX-10HP | 1.5 Liter | 10 HP | 14" | Plug-in | Red |
| 8 HP Red 14" max height Plug-in Start Snow Blower | 2AGX-08HP | 1.0 Liter | 8 HP | 18" | Plug-in | Red |
| 10 HP Red 14" max height Plug-in Start Snow Blower | 2AGX-10HP | 1.5 Liter | 10 HP | 18" | Plug-in | Red |
| 8 HP Red 14" max height Plug-in Start Snow Blower | 2AGX-08HP | 1.0 Liter | 8 HP | 24" | Plug-in | Red |
| 10 HP Red 14" max height Plug-in Start Snow Blower | 2AGX-10HP | 1.5 Liter | 10 HP | 24" | Plug-in | Red |
| 5 HP Green 14" max height Pull Start Snow Blower | 2AGX-05HP | 0.5 Liter | 5 HP | 14" | Pull | Green |
| 8 HP Green 14" max height Pull Start Snow Blower | 2AGX-08HP | 1.0 Liter | 8 HP | 14" | Pull | Green |
| 10 HP Green 14" max height Pull Start Snow Blower | 2AGX-10HP | 1.5 Liter | 10 HP | 14" | Pull | Green |
| 8 HP Green 18" max height Pull Start Snow Blower | 2AGX-08HP | 1.0 Liter | 8 HP | 18" | Pull | Green |
| 10 HP Green 18" max height Pull Start Snow Blower | 2AGX-10HP | 1.5 Liter | 10 HP | 18" | Pull | Green |
| 8 HP Green 24" max height Pull Start Snow Blower | 2AGX-08HP | 1.0 Liter | 8 HP | 24" | Pull | Green |
| 10 HP Green 24" max height Pull Start Snow Blower | 2AGX-10HP | 1.5 Liter | 10 HP | 24" | Pull | Green |
| 5 HP Green 14" max height Battery Start Snow Blower | 2AGX-05HP | 0.5 Liter | 5 HP | 14" | Battery | Green |
| 8 HP Green 14" max height Battery Start Snow Blower | 2AGX-08HP | 1.0 Liter | 8 HP | 14" | Battery | Green |
| 10 HP Green 14" max height Battery Start Snow Blower | 2AGX-10HP | 1.5 Liter | 10 HP | 14" | Battery | Green |
| 8 HP Green 14" max height Battery Start Snow Blower | 2AGX-08HP | 1.0 Liter | 8 HP | 18" | Battery | Green |
| 10 HP Green 14" max height Battery Start Snow Blower | 2AGX-10HP | 1.5 Liter | 10 HP | 18" | Battery | Green |
| 8 HP Green 14" max height Battery Start Snow Blower | 2AGX-08HP | 1.0 Liter | 8 HP | 24" | Battery | Green |
| 10 HP Green 14" max height Battery Start Snow Blower | 2AGX-10HP | 1.5 Liter | 10 HP | 24" | Battery | Green |
| 5 HP Green 14" max height Plug-in Start Snow Blower | 2AGX-05HP | 0.5 Liter | 5 HP | 14" | Plug-in | Green |
| 8 HP Green 14" max height Plug-in Start Snow Blower | 2AGX-08HP | 1.0 Liter | 8 HP | 14" | Plug-in | Green |
| 10 HP Green 14" max height Plug-in Start Snow Blower | 2AGX-10HP | 1.5 Liter | 10 HP | 14" | Plug-in | Green |
| 8 HP Green 14" max height Plug-in Start Snow Blower | 2AGX-08HP | 1.0 Liter | 8 HP | 18" | Plug-in | Green |
| 10 HP Green 14" max height Plug-in Start Snow Blower | 2AGX-10HP | 1.5 Liter | 10 HP | 18" | Plug-in | Green |
| 8 HP Green 14" max height Plug-in Start Snow Blower | 2AGX-08HP | 1.0 Liter | 8 HP | 24" | Plug-in | Green |
| 10 HP Green 14" max height Plug-in Start Snow Blower | 2AGX-10HP | 1.5 Liter | 10 HP | 24" | Plug-in | Green |
| 5 HP Beige 14" max height Pull Start Snow Blower | 2AGX-05HP | 0.5 Liter | 5 HP | 14" | Pull | Beige |
| 8 HP Beige 14" max height Pull Start Snow Blower | 2AGX-08HP | 1.0 Liter | 8 HP | 14" | Pull | Beige |
| 10 HP Beige 14" max height Pull Start Snow Blower | 2AGX-10HP | 1.5 Liter | 10 HP | 14" | Pull | Beige |
| 8 HP Beige 18" max height Pull Start Snow Blower | 2AGX-08HP | 1.0 Liter | 8 HP | 18" | Pull | Beige |
| 10 HP Beige 18" max height Pull Start Snow Blower | 2AGX-10HP | 1.5 Liter | 10 HP | 18" | Pull | Beige |
| 8 HP Beige 24" max height Pull Start Snow Blower | 2AGX-08HP | 1.0 Liter | 8 HP | 24" | Pull | Beige |
| 10 HP Beige 24" max height Pull Start Snow Blower | 2AGX-10HP | 1.5 Liter | 10 HP | 24" | Pull | Beige |
| 5 HP Beige 14" max height Battery Start Snow Blower | 2AGX-05HP | 0.5 Liter | 5 HP | 14" | Battery | Beige |
| 8 HP Beige 14" max height Battery Start Snow Blower | 2AGX-08HP | 1.0 Liter | 8 HP | 14" | Battery | Beige |
| 10 HP Beige 14" max height Battery Start Snow Blower | 2AGX-10HP | 1.5 Liter | 10 HP | 14" | Battery | Beige |
| 8 HP Beige 14" max height Battery Start Snow Blower | 2AGX-08HP | 1.0 Liter | 8 HP | 18" | Battery | Beige |
| 10 HP Beige 14" max height Battery Start Snow Blower | 2AGX-10HP | 1.5 Liter | 10 HP | 18" | Battery | Beige |
| 8 HP Beige 14" max height Battery Start Snow Blower | 2AGX-08HP | 1.0 Liter | 8 HP | 24" | Battery | Beige |
| 10 HP Beige 14" max height Battery Start Snow Blower | 2AGX-10HP | 1.5 Liter | 10 HP | 24" | Battery | Beige |
| 5 HP Beige 14" max height Plug-in Start Snow Blower | 2AGX-05HP | 0.5 Liter | 5 HP | 14" | Plug-in | Beige |
| 8 HP Beige 14" max height Plug-in Start Snow Blower | 2AGX-08HP | 1.0 Liter | 8 HP | 14" | Plug-in | Beige |
| 10 HP Beige 14" max height Plug-in Start Snow Blower | 2AGX-10HP | 1.5 Liter | 10 HP | 14" | Plug-in | Beige |

SUMMARY TABLE A -continued

| Part Name | Engine Style | Engine Size | Power Rating | Scoop Ht. | Start Mech. | Color |
|---|---|---|---|---|---|---|
| 8 HP Beige 14" max height Plug-in Start Snow Blower | 2AGX-08HP | 1.0 Liter | 8 HP | 18" | Plug-in | Beige |
| 10 HP Beige 14" max height Plug-in Start Snow Blower | 2AGX-10HP | 1.5 Liter | 10 HP | 18" | Plug-in | Beige |
| 8 HP Beige 14" max height Plug-in Start Snow Blower | 2AGX-08HP | 1.0 Liter | 8 HP | 24" | Plug-in | Beige |
| 10 HP Beige 14" max height Plug-in Start Snow Blower | 2AGX-10HP | 1.5 Liter | 10 HP | 24" | Plug-in | Beige |

As a comparison, the above table, written out in a tab-delimited format, is approximately 6,400 bytes while the XML data package file is approximately 1,700 bytes. Generally the more data stored in constant list form, the greater the gains in compact storage. An exponential trend is followed, such that in extreme cases it is not practical to fully expand the table as the resultant tables can contain millions and in some cases billions of sizes.

Round Duct Tee Example

This example represents a Round Duct Tee. This example is similar to the Rectangular Duct Tee illustrated in FIG. 1, but contains fewer size variations due to the single dimension used at each duct connection, helpful in simplifying the sample without compromising its real world value.

Figure 3:
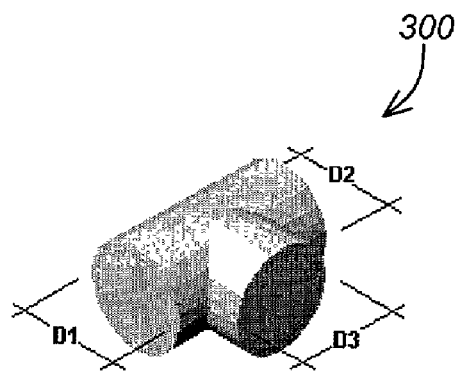
FIG. 3 illustrates a round duct tee in accordance with one or more embodiments of the invention.

FIG. 3 illustrates the round duct tee in accordance with one or more embodiments of the invention. As illustrated, the duct tee 300 contains three (3) size dimensions (D1, D2, and D3), one for each of the three (3) duct connections, plus material and gauge lists. The three (3) size dimensions D1-D3 range from 2" to 48" (in 2" increments) for a total of twenty-four (24) values for each duct connection. Five (5) different material may be used for the duct tee 300, and ten (10) different gauge values.

The following data package defines the part fully in approximately a 4,000 byte XML file.

```
<?xml version="1.0"?>
<pPackage desc="Product Package Sample">
    <ConstantList name="D1" dataType="float" unit="inch">
        <Item id="i0">2.00</Item>
        <Item id="i1">4.00</Item>
        <Item id="i2">6.00</Item>
        <Item id="i3">8.00</Item>
        <Item id="i4">10.0</Item>
        <Item id="i5">12.0</Item>
        <Item id="i6">14.0</Item>
        <Item id="i7">16.0</Item>
        <Item id="i8">18.0</Item>
        <Item id="i9">20.0</Item>
        <Item id="i10">22.0</Item>
        <Item id="i11">24.0</Item>
        <Item id="i12">26.0</Item>
        <Item id="i13">28.0</Item>
        <Item id="i14">30.0</Item>
        <Item id="i15">32.0</Item>
        <Item id="i16">34.0</Item>
        <Item id="i17">36.0</Item>
        <Item id="i18">38.0</Item>
        <Item id="i19">40.0</Item>
        <Item id="i20">42.0</Item>
        <Item id="i21">44.0</Item>
        <Item id="i22">46.0</Item>
        <Item id="i23">48.0</Item>
    </ConstantList>
    <ConstantList name="D2" dataType="float" unit="inch">
        <Item id="i0">2.00</Item>
        <Item id="i1">4.00</Item>
        <Item id="i2">6.00</Item>
        <Item id="i3">8.00</Item>
        <Item id="i4">10.0</Item>
        <Item id="i5">12.0</Item>
        <Item id="i6">14.0</Item>
        <Item id="i7">16.0</Item>
        <Item id="i8">18.0</Item>
        <Item id="i9">20.0</Item>
        <Item id="i10">22.0</Item>
        <Item id="i11">24.0</Item>
        <Item id="i12">26.0</Item>
        <Item id="i13">28.0</Item>
        <Item id="i14">30.0</Item>
```

-continued

```
        <Item id="i15">32.0</Item>
        <Item id="i16">34.0</Item>
        <Item id="i17">36.0</Item>
        <Item id="i18">38.0</Item>
        <Item id="i19">40.0</Item>
        <Item id="i20">42.0</Item>
        <Item id="i21">44.0</Item>
        <Item id="i22">46.0</Item>
        <Item id="i23">48.0</Item>
    </ConstantList>
    <ConstantList name="D3" dataType="float" unit="inch">
        <Item id="i0">2.00</Item>
        <Item id="i1">4.00</Item>
        <Item id="i2">6.00</Item>
        <Item id="i3">8.00</Item>
        <Item id="i4">10.0</Item>
        <Item id="i5">12.0</Item>
        <Item id="i6">14.0</Item>
        <Item id="i7">16.0</Item>
        <Item id="i8">18.0</Item>
        <Item id="i9">20.0</Item>
        <Item id="i10">22.0</Item>
        <Item id="i11">24.0</Item>
        <Item id="i12">26.0</Item>
        <Item id="i13">28.0</Item>
        <Item id="i14">30.0</Item>
        <Item id="i15">32.0</Item>
        <Item id="i16">34.0</Item>
        <Item id="i17">36.0</Item>
        <Item id="i18">38.0</Item>
        <Item id="i19">40.0</Item>
        <Item id="i20">42.0</Item>
        <Item id="i21">44.0</Item>
        <Item id="i22">46.0</Item>
        <Item id="i23">48.0</Item>
    </ConstantList>
    <ConstantList name="Material" dataType="string">
        <Item id="i0">Galvanized Steel</Item>
        <Item id="i1">304 Stainless Steel</Item>
        <Item id="i2">316 Stainless Steel</Item>
        <Item id="i3">Copper</item>
        <Item id="i4">Fiberglass</Item>
    </ConstantList>
    <ConstantList name="Gauge" dataType="int">
        <Item id="i0">10</Item>
        <Item id="i1">12</Item>
        <Item id="i2">14</Item>
        <Item id="i3">16</Item>
        <Item id="i4">18</Item>
        <Item id="i5">20</Item>
        <Item id="i6">22</Item>
        <Item id="i7">24</Item>
        <Item id="i8">26</Item>
        <Item id="i9">28</Item>
    </ConstantList>
    <Calculation desc="Conditional Test 1 D1 less than 32" dataType="bool"
        name="CT1" context="Conditional_Test">$D1 < 32</Calculation>
    <Calculation desc="Conditional Test 2 D3 less than 32" dataType="bool"
        name="CT2" context="Conditional_Test">$D3 < 32</Calculation>
    <Calculation desc="Conditional Test 3 Small Size" dataType="bool" name="CT3"
        context=Conditional_Test">$CT1 Or $CT2</Calculation>
    <Calculation desc="Conditional Test 4 Large Gauge" dataType="bool" name="CT4"
        context="Conditional_Test">$Gauge >= 18</Calculation>
    <Calculation desc="Validation Test 1 Large Gauge Rule" dataType="bool"
        name="VT1" context="PartSizeValidation_Test">1 - ($CT3*$CT4)</Calculation>
    <Calculation desc="Conditional Test 5 Remove Duplicates Rule dataType="bool"
        name="VT2" context="PartSizeValidation_Test">$D1 >= $D2</Calculation>
    <Calculation desc="Size Name" dataType="string" name="Name"
        context="Catalog_PartSizeName">FormatNumber($D1,0) + " x " +
        FormatNumber($D2,0) + " x " + FormatNumber($D3,0) + " inch Round Duct
        Tee"</Calculation>
</pPackage>
```

It is not practical to fully expand a representative table for comparison, as the resulting table has a maximum number of sizes of 691,200 (excluding reduction of sizes list using rules). The maximum number of sizes is equal to 24×24×24× 5×10=691,200.

Part validation rules include gauge restrictions based on size and duplicate size elimination. The round duct tee 300 uses two rules to establish valid parts. The gauge rule uses three (3) conditional tests, CT1, CT2, and CT3 and then performs the validation using VT1 as follows:

| | | |
|---|---|---|
| CT1 | <Calculation>$D1 < 32</Calculation> | → CT1 equivalent to "D1 < 32" |
| CT2 | <Calculation>$D3 < 32</Calculation> | → CT2 equivalent to "D3 < 32" |
| CT3 | <Calculation>$CT1 \|\| $CT2</Calculation> | → CT3 equivalent to "CT1 or CT2" |
| CT4 | <Calculation>$Gauge >= 18</Calculation> | → CT4 equivalent to "Gauge >= 18" |
| VT1 | <Calculation>1 − ($CT3*$CT4)</Calculation> | → False if both CT3 and CT4 are True |

Each calculation is a boolean value that evaluates true (a value of 1) or false (a value of 0) depending on the condition stated within the calculation. As indicated, calculation CT1 evaluates to true when D1 is less than 32. Similarly, CT2 evaluates to true if D3 is less than 32. CT3 evaluates to true if either CT1 or CT2 is true. Thus, CT3 is true if either D1 or D3 is less than 32 (i.e., a small size test). CT4 evaluates to true if the gauge is greater than or equal to 18 (i.e., a large gauge test).

Further calculations are then performed with numerical substitution as shown in VT1. VT1 evaluates to false if both CT3 and CT4 are true. Thus, VT1 is false if there is either a small size or a large gauge. When VT1 is false, the row is invalid. Accordingly, round duct tees 300 with a small size or large gauge are not valid (and not added to the expanded table based on the value in VT1).

The size duplication rule (i.e., Conditional Test 5 Remove Duplicates Rule) simply eliminates any cases where D2 is larger than D1. Because of the symmetry of the round duct tee 300, these sizes are duplicates of the reversed parameters where D1 is greater than D2. The elimination calculation is expanded table is displayed in a details window 406. In the example illustrated in FIG. 4, over 3 million size combinations are found (3,525,827).

To "filter" this large number of sizes/combinations, the part filter tab 408 may be used. The mechanism for this application feature is to load the data package into memory, and repeatedly "expand" the resultant table by applying a query (filter) to limit the results. This query operates similar to the validation rules/calculations, but is applied as special conditions rather than absolute rules. The results are identical, sizes are filtered out and only valid results are displayed in the resultant table.

Figure 4:
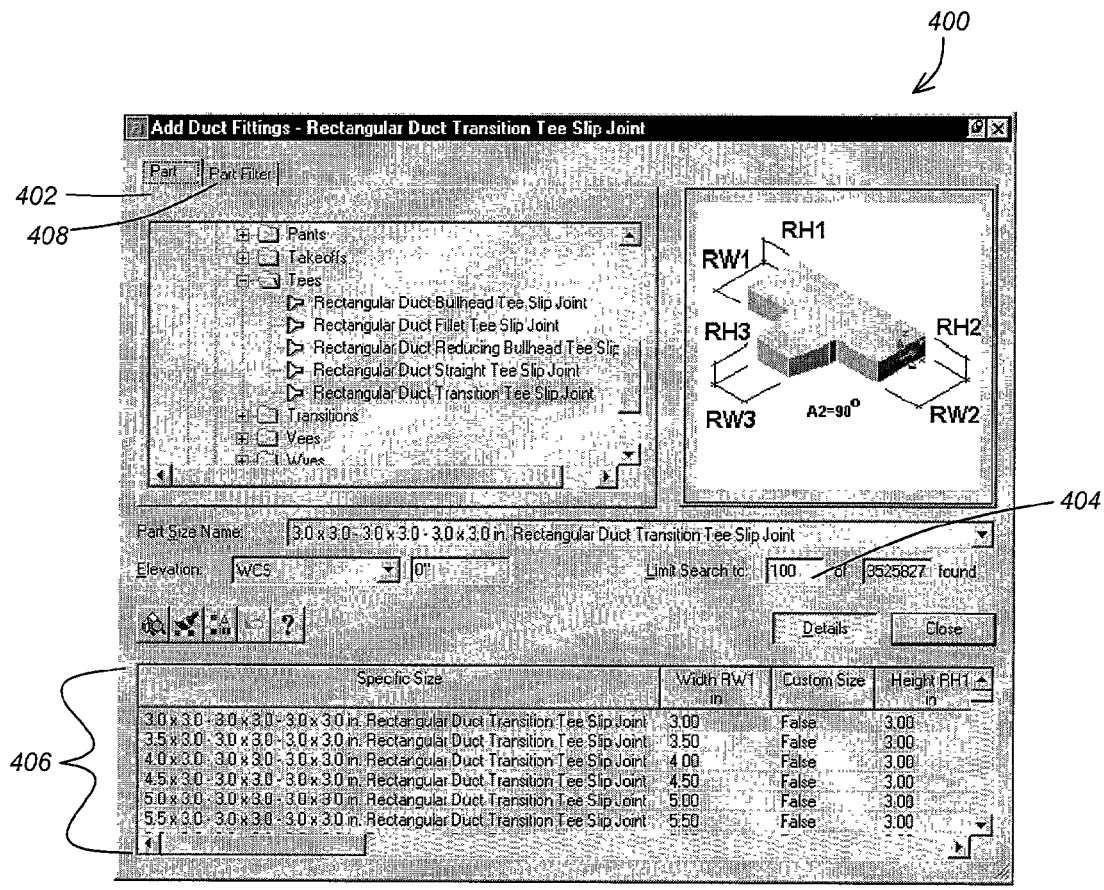
FIG. 4 is a screen shot that illustrates the use of a resultant expanded table and how queries (part filters) can be used to narrow the number of parts displayed in a result screen in accordance with one or more embodiments of the invention.
Figure 5:
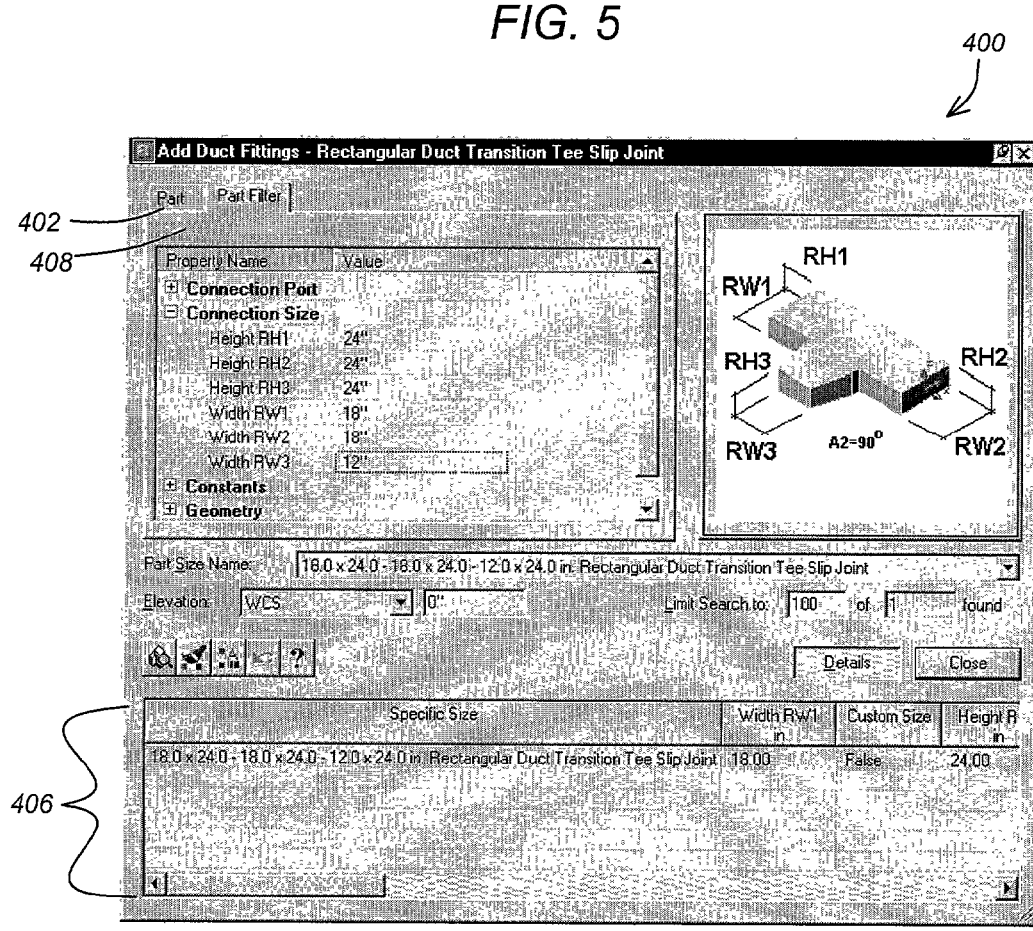
FIG. 5 illustrates a part filter display window of FIG. 4 in accordance with one or more embodiments of the invention.

FIG. 5 illustrates the part filter 408 display window of FIG. 4. As indicated, part filter window 408 is used to specify various parameters and conditions for the filter. Once the filter is applied to the expanded table, the results are displayed in window 406.

Figure 6:
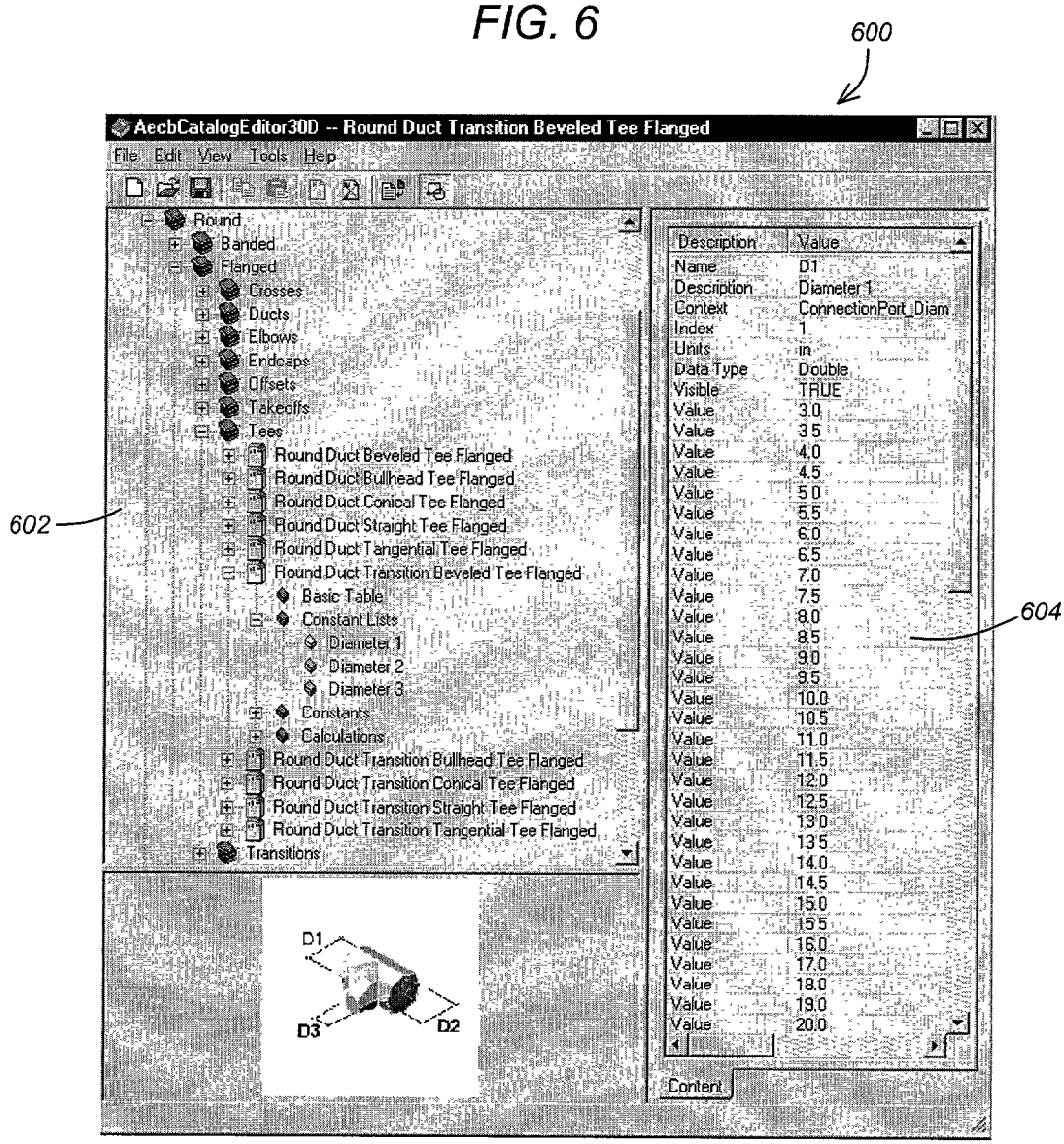
FIG. 6 illustrates a catalog editor in accordance with one or more embodiments of the invention.

Additionally, a user may directly edit a data package using a catalog editor. FIG. 6 illustrates a catalog editor in drawing program or other application 208 in accordance with one or more embodiments of the invention. In the catalog editor 600,

| | | |
|---|---|---|
| VT2 | <Calculation>$D1 >= $D2</Calculation> | → False if D2 is greater than D1 |

Based on calculation VT1 and VT2, the resulting expanded table will not contain any parts which have D2>D1, or with a Large Gauge matched to a Small Size.

The last calculation in the example provides the value for a column in the expanded table:

```
<Calculation desc="Size Name" dataType="string" name="Name"
    context="Catalog_PartSizeName">FormatNumber($D1,0) + " x " +
    FormatNumber($D2,0) + " x " + FormatNumber($D3,0) + " inch Round Duct
    Tee"</Calculation>
```

The calculation provides for the concatenation of various parameters and elements. Namely, the value of each row in a "Size Name" column in the expanded table contains the value of D1, the letter "x", the value of D2, the letter "x", the value of D3, and the phrase "inch Round Duct Tee".

Graphical User Interface

The calculations, parameters, and basic table may be manipulated by a user through a graphical user interface. A user may utilize one or more queries or filters to display a portion of the expanded table.

FIG. 4 is a screen shot from drawing program 208 that illustrates the use of a resultant expanded table and how queries (part filters) can be used to narrow the number of part sizes displayed in a result screen. As shown, a dialog window 400 is used to add/select a duct fitting. As illustrated, a part catalog window 402 is navigated using a tree control. Once a part is selected, the part's data package is partially or fully expanded (according to a search limit 404) and the resultant a particular product (or product category) is selected through a tree control 602. A particular product may be expanded through the tree control 602 to allow the user to select individual parameters (e.g., the basic table, constant lists, and/or calculations). Once an individual parameter has been selected the descriptions and values of attributes/features of the parameter (within the data package) are displayed in a content window 604. The content window 604 may be utilized to modify each attribute.

General Flow

Figure 7:
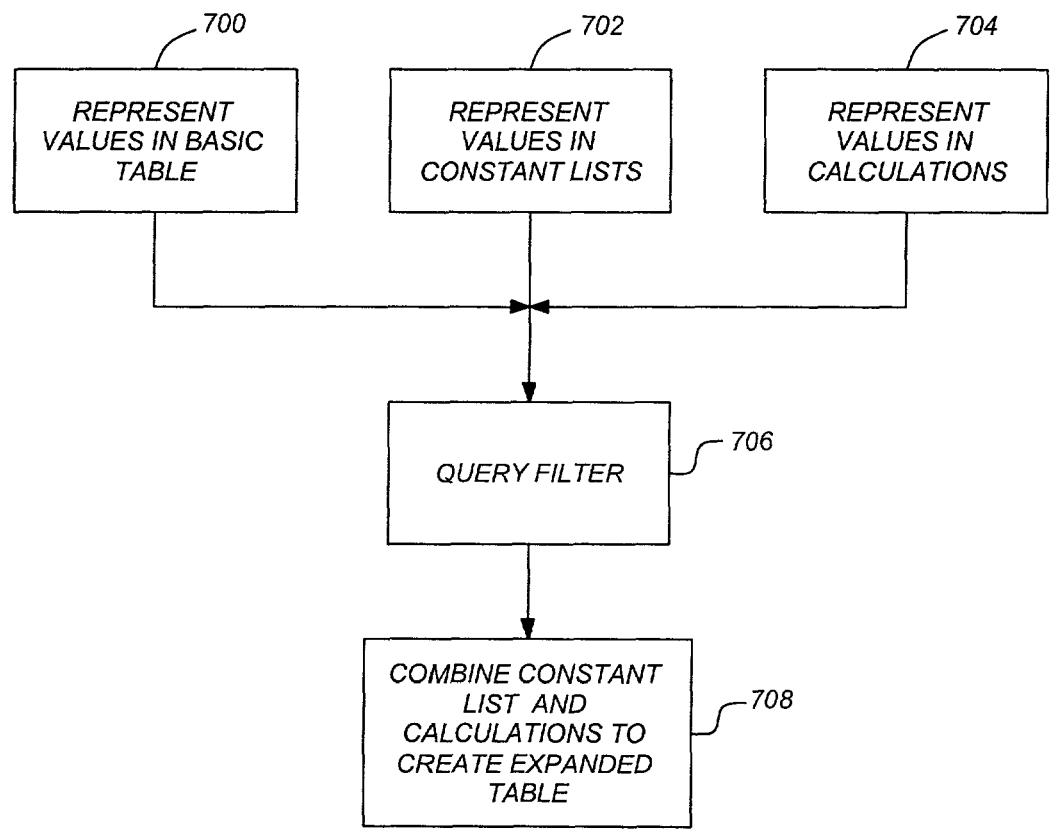
FIG. 7 is a flow chart illustrating the representation of data in a self-expanding data package in accordance with one or more embodiments of the invention.

FIG. 7 is a flow chart illustrating the representation of data in a self-expanding data package in accordance with one or more embodiments of the invention. At step 700, one or more values are represented/generated in a basic table. At step 702, one or more values are represented in a set of one or more constant lists in the self-expanding data package. At step 704, one or more calculations, that operate on one or more values in the set of one or more constant lists, are represented/generated in the self-expanding data package.

The basic table generated at step 700 may have zero or more table tows and provides the foundational structure for the expanded table. To create the expanded table, every value in each constant list is combined with each basic table tow. Further, multiple basic tables may be used.

As described above, the calculations may be used in a variety of contexts. Thus, the calculations may be used to test the validity of the expanded table tow. Alternatively, the calculations may be utilized to perform a precursor conditional test that is then used to test the validity of the expanded table row. In yet another context, the calculations may be used to provide additional data that is then used in an expanded table tow or to eliminate a duplicative row.

Additionally, the calculations may not be absolute, but may comprise one or more filters that limit results displayed from the expanded table rows. Such calculations, filters, and/or self-expanding data package itself may be selected and/or edited through a graphical user interface.

Once the data (product data or otherwise) is represented/generated in the self-expanding data package, the package may be transmitted easily and efficiently across a network 202 for receipt and use by a client 204 or computer. Accordingly, once appropriately represented/generated, the logic for expanding the data package into the fully expanded table is defined within the data package itself (i.e., the basic table, constant lists, and calculations).

At optional step 706, a query filter may be applied to the values. The query filter may or may not be used. The filter limits the values obtain in steps 700-704 to be used to create an expanded table at step 708. Differences may or may not be apparent between a calculation and a query filter. A calculation may serve to restrict a row or the production of a product in the expanded table such that the product/row cannot be selected or used (i.e., the product does not exist). However, the filter may be selected by a user (i.e., through a graphical user interface) and merely limits the products that are displayed or are of interest to the user. Thus, with a filter, the product may exist but is not displayed. Nonetheless, both filters and calculations may be used simultaneously and may effectively produce the same result from a user's perspective.

At step 708, the self-expanding data package is received and expanded into an expanded table having expanded table rows, by combining every value in each constant list with any/all combinations of values from remaining parameters and performing the one or more calculations on the one or more values. If multiple basic tables are used, one or more of the tables may be combined at step 708.

Please note that the query filter performed at step 706 may be performed after step 708 if desired. In such a situation, all possible products are created, and then a limited view of the products are displayed. However, if step 706 is performed prior to step 708, the filter may limit the rows that are created, thereby reducing the processing time.

CONCLUSION

This concludes the description of the preferred embodiment of the invention. The following describes some alternative embodiments for accomplishing the present invention. For example, any type of computer, such as a mainframe, minicomputer, or personal computer, or computer configuration, such as a timesharing mainframe, local area network, or standalone personal computer, could be used with the present invention. Any type of application, such as Catalog Publishing, CAD, Project Estimating, Procurement, or Facility Management applications may utilize the invention.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A self-expanding product data package for product data comprising:
   the self-expanding product data package on a non-transitory medium;
   basic table data having one or more table rows, wherein each row represents a partial definition of a product;
   a set of one or more constant lists having one or more values; and
   one or more row validation calculations;
   wherein use of the set of constant lists and row validation calculations provides a mechanism for compact data storage, wherein the self-expanding data package is capable of expansion into an expanded table having expanded table rows wherein each expanded table row represents a product and comprises a combination such that:
   for each constant list of values, every list member is combined with all other basic table rows and additional list members to produce every possible combination; and
   the row validation calculations are applied to test validity of the expanded table rows, and only those expanded table rows that are valid are maintained in the expanded table.

2. The self-expanding product data package of claim 1 further comprising a calculation utilized to perform a precursor conditional test that is used in one or more row validation calculations.

3. The self-expanding product data package of claim 1 further comprising a calculation utilized to provide additional data used in the expanded table.

4. The self-expanding product data package of claim 1 wherein the self-expanding data package comprises product data for use in a computer-aided design application.

5. The self-expanding product data package of claim 1 wherein the one or more of the row validation calculations provide for eliminating duplicate expanded table rows.

6. The self-expanding product data package of claim 1 wherein the basic table data, set of one or more constant lists, and one or more row validation calculations are specified using extensible markup language (XML).

7. The self-expanding product data package of claim 1 wherein the row validation calculations are selected through a graphical user interface.

8. The self-expanding product data package of claim 1 wherein the self-expanding data package is transmitted across a network.

9. The self-expanding product data package of claim 1 wherein one or more row validation calculations comprise one or more filters that limit results displayed from the expanded table rows.

10. The self-expanding product data package of claim 1 wherein an editor provides an ability to directly edit the self-expanding data package.

11. The self-expanding product data package of claim 1 wherein logic for expanding the data package into the expanded table is fully defined within the data package and the data.

12. A method for generating product data in a self-expanding data package in a computer system comprising:
    generating one or more values in a set of one or more constant lists and storing said one or more values in the self-expanding data package, wherein the self-expanding data package is for product data;

generating one or more calculations that operate on one or more values in the set of one or more constant lists and storing said one or more calculations in the self-expanding data package;

transmitting the self-expanding data package to a second computer system that expands the self-expanding data package into an expanded table having expanded table rows, wherein each expanded table row represents a product and comprises a combination and each combination is generated by combining every value in each constant list with any combination of values from remaining parameters and performing the one or more calculations on the one or more values, wherein the one or more calculations eliminate one more expanded table rows.

13. The method of claim 12 further comprising, generating one or more basic table data having one or more table rows, and storing said one or more basic table data in the self expanding data package, wherein the self-expanding data package is further expanded by combining every value in each constant list with each basic table row.

14. The method of claim 12, wherein one or more calculations are applied to test validity of the expanded table rows, and only those expanded table rows that are valid are maintained in the expanded table.

15. The method of claim 14, wherein one or more calculations are utilized to perform a precursor conditional test that is used to test validity of the expanded table rows.

16. The method of claim 12, wherein one or more calculations are utilized to provide additional data used in the expanded table.

17. The method of claim 12, wherein the self-expanding data package comprises product data for use in a computer-aided design application.

18. The method of claim 12, wherein one or more calculations provide for eliminating duplicate expanded table rows.

19. The method of claim 12, wherein the self-expanding data package is written in extensible markup language (XML).

20. The method of claim 12, wherein one or more calculations are selected through a graphical user interface.

21. The method of claim 12, wherein the self-expanding data package is transmitted across a network.

22. The method of claim 12, wherein one or more calculations comprise one or more filters that limit results displayed from the expanded table rows.

23. The method of claim 12, wherein an editor is used to directly edit the self-expanding data package.

24. The method of claim 12, wherein logic for expanding the data package into the expanded table is fully defined within the data package and the data.

25. A method for utilizing product data in a self-expanding data package in a computer system comprising:
receiving a self-expanding data package comprising one or more values in a set of one or more constant lists and one or more calculations that operate on one or more values in the set of one or more constant lists, wherein the self-expanding data package is for product data;
expanding the self-expanding data package into an expanded table having expanded table rows, wherein each expanded table row represents a product and comprises a combination and each combination is generated by combining every value in each constant list with any combination of values from remaining parameters and performing the one or more calculations on the one or more values, wherein the one or more calculations eliminate one more expanded table rows.

26. The method of claim 25, wherein:
the self-expanding data package further comprises one or more basic table data having one or more table rows; and
the expanding further comprises combining every value in each constant list with each basic table row.

27. The method of claim 25, wherein:
one or more calculations test validity of the expanded table rows; and
only those expanded table rows that are valid are maintained in the expanded table.

28. The method of claim 27, wherein one or more calculations perform a precursor conditional test that is used to test validity of the expanded table rows.

29. The method of claim 25, wherein one or more calculations provide additional data used in the expanded table.

30. The method of claim 25, wherein the self-expanding data package comprises product data for use in a computer-aided design application.

31. The method of claim 25, wherein one or more calculations eliminate duplicate rows or otherwise apply business rules to eliminate unwanted rows in the resulting expanded table.

32. The method of claim 25, wherein the self-expanding data package is written in extensible markup language (XML).

33. The method of claim 25, wherein one or more calculations are selected through a graphical user interface.

34. The method of claim 25, wherein the self-expanding data package is received from across a network.

35. The method of claim 25, wherein one or more calculations comprise one or more filters that limit results displayed from the expanded table rows.

36. The method of claim 25, wherein an editor provides an ability to directly edit the self-expanding data package.

37. The method of claim 25, wherein logic for expanding the data package into the expanded table is fully defined within the data package and the data.

38. An apparatus for generating product data in a self-expanding data package in a computer system comprising:
(a) a computer system having a non-transitory memory and a data storage device coupled thereto;
(b) one or more computer programs, performed by the computer system, for generating a self-expanding data package and storing the self-expanding data package in the memory, wherein the self-expanding data package is for product data and comprises:
(i) one or more values in a set of one or more constant lists; and
(ii) one or more calculations that operate on one or more values in the set of one or more constant lists;
wherein the self-expanding data package is transmitted to a second computer system that expands the self-expanding data package into an expanded table having expanded table rows, wherein each expanded table row represents a product and comprises a combination and each combination is generated by combining every value in each constant list with any combination of values from remaining parameters and performing the one or more calculations on the one or more values, wherein the one or more calculations eliminate one more expanded table rows.

39. The apparatus of claim 38, wherein:
the self-expanding data package further comprises one or more basic table data having one or more table rows; and
the self-expanding data package is further expanded by combining every value in each constant list with each basic table row.

40. The apparatus of claim 38, wherein one or more calculations are applied to test validity of the expanded table rows, and only those expanded table rows that are valid are maintained in the expanded table.

41. The apparatus of claim 40, wherein one or more calculations are utilized to perform a precursor conditional test that can be used to test validity of the expanded table rows.

42. The apparatus of claim 38, wherein one or more calculations are utilized to provide additional data used in the expanded table.

43. The apparatus of claim 38, wherein the self-expanding data package comprises product data for use in a computer-aided design application.

44. The apparatus of claim 38, wherein one or more calculations provide for eliminating duplicate expanded table rows.

45. The apparatus of claim 38, wherein the self-expanding data package is written in extensible markup language (XML).

46. The apparatus of claim 38, further comprising a graphical user interface displayed by the computer system for selecting the one or more calculations.

47. The apparatus of claim 38, wherein the one or more computer programs are further configured to transmit the self-expanding data package across a network.

48. The apparatus of claim 38, wherein one or more calculations comprise one or more filters that limit results displayed from the expanded table rows.

49. The apparatus of claim 38, wherein one or more of the computer programs comprise an editor that is used to directly edit the self-expanding data package.

50. The apparatus of claim 38, wherein logic for expanding the data package into the expanded table is fully defined within the data package and the data.

51. An apparatus for utilizing product data in a self-expanding data package in a computer system comprising:
(a) a computer system having a non-transitory memory and a data storage device coupled thereto;
(b) one or more computer programs, performed by the computer system, for receiving a self-expanding data package stored in the memory, wherein the self-expanding data package is for product data and the self-expanding data package comprises:
(i) one or more values in a set of one or more constant lists; and
(ii) one or more calculations that operate on one or more values in the set of one or more constant lists; and
(c) one or more computer programs, performed by the computer system, for expanding the self-expanding data package into an expanded table having expanded table rows, wherein each expanded table row represents a product and comprises a combination and each combination is generated by combining every value in each constant list with any combination of values from remaining parameters and performing the one or more calculations on the one or more values, wherein the one or more calculations eliminate one more expanded table rows.

52. The apparatus of claim 51, wherein:
the self-expanding data package further comprises basic table data having one or more table rows; and
the computer program is further configured to expand the self-expanding data package by combining every value in each constant list with each basic table row.

53. The apparatus of claim 51, wherein one or more calculations are applied to test validity of the expanded table rows, and only those expanded table rows that are valid are maintained in the expanded table.

54. The apparatus of claim 53, wherein one or more calculations are utilized to perform a precursor conditional test that is used to test validity of the expanded table rows.

55. The apparatus of claim 51, wherein one or more calculations are utilized to provide additional data used in the expanded table.

56. The apparatus of claim 51, wherein the self-expanding data package comprises product data for use in a computer-aided design application.

57. The apparatus of claim 51, wherein one or more calculations provide for eliminating duplicate expanded table rows.

58. The apparatus of claim 51, wherein the self-expanding data package is written in extensible markup language (XML).

59. The apparatus of claim 51, further comprising a graphical user interface displayed by the computer system for selecting the one or more calculations.

60. The apparatus of claim 51, wherein the self-expanding data package is received from across a network.

61. The apparatus of claim 51, wherein one or more calculations comprise one or more filters that limit results displayed from the expanded table rows.

62. The apparatus of claim 51, further comprising an editor performed by the computer system that provides an ability to directly edit the self-expanding data package.

63. The apparatus of claim 51, wherein logic for expanding the data package into the expanded table is fully defined within the data package and the data.

64. An article of manufacture comprising a non-transitory program storage medium readable by a computer and embodying one or more instructions executable by the computer to perform a method for generating product data in a self-expanding data package in a computer system, the method comprising:
generating, in the self-expanding data package, one or more values in a set of one or more constant lists, wherein the self-expanding data package is for product data;
generating, in the self-expanding data package, one or more calculations that operate on one or more values in the set of one or more constant lists;
wherein the self-expanding data package is transmitted to a second computer system that expands the self-expanding data package into an expanded table having expanded table rows, wherein each expanded table row represents a product and comprises a combination and each combination is generated by combining every value in each constant list with any combination of values from remaining parameters and performing the one or more calculations on the one or more values, wherein the one or more calculations eliminate one more expanded table rows.

65. The article of manufacture of claim 64, the method further comprising, generating, in the self-expanding data package, basic table data having one or more table rows, wherein the self-expanding data package is further expanded by combining every value in each constant list with each basic table row.

66. The article of manufacture of claim 64, wherein one or more calculations are applied to test a validity of the expanded table rows, and only those expanded table rows that are valid are maintained in the expanded table.

67. The article of manufacture of claim 66, wherein one or more calculations are utilized to perform a precursor conditional test that is used to test validity of the expanded table rows.

68. The article of manufacture of claim 64, wherein one or more calculations are utilized to provide additional data used in the expanded table.

69. The article of manufacture of claim 64, wherein the self-expanding data package comprises product data for use in a computer-aided design application.

70. The article of manufacture of claim 64, wherein one or more calculations eliminate duplicate expanded table rows.

71. The article of manufacture of claim 64, wherein the self-expanding data package is written in extensible markup language (XML).

72. The article of manufacture of claim 64, wherein one or more calculations are selected through a graphical user interface.

73. The article of manufacture of claim 64, wherein the method further comprises transmitting the self-expanding data package across a network.

74. The article of manufacture of claim 64, wherein one or more calculations comprise one or more filters that limit results displayed from the expanded table rows.

75. The article of manufacture of claim 64, wherein an editor is used to directly edit the self-expanding data package.

76. The article of manufacture of claim 64, wherein logic for expanding the data package into the expanded table is fully defined within the data package and the data.

77. An article of manufacture comprising a non-transitory program storage medium readable by a computer and embodying one or more instructions executable by the computer to perform a method for utilizing product data in a self-expanding data package in a computer system, the method comprising:
(a) receiving a self-expanding data package wherein the self-expanding data package is for product data and the self-expanding data package comprises:
  (i) one or more values in a set of one or more constant lists; and
  (ii) one or more calculations that operate on one or more values in the set of one or more constant lists; and
(b) expanding the self-expanding data package into an expanded table having expanded table rows, wherein each expanded table row represents a product and comprises a combination and each combination is generated by combining every value in each constant list with any combination of values from remaining parameters and performing the one or more calculations on the one or more values, wherein the one or more calculations eliminate one more expanded table rows.

78. The article of manufacture of claim 77, wherein:
the self-expanding data package further comprises basic table data having one or more table rows; and
the self-expanding data package is further expanded by combining every value in each constant list with each basic table row.

79. The article of manufacture of claim 77, wherein one or more calculations are applied to test validity of the expanded table rows, and only those expanded table rows that are valid are maintained in the expanded table.

80. The article of manufacture of claim 79, wherein one or more calculations are utilized to perform a precursor conditional test that is used to test validity of the expanded table rows.

81. The article of manufacture of claim 77, wherein one or more calculations are utilized to provide additional data used in the expanded table.

82. The article of manufacture of claim 77, wherein the self-expanding data package comprises product data for use in a computer-aided design application.

83. The article of manufacture of claim 77, wherein one or more calculations provide for eliminating duplicate expanded table rows.

84. The article of manufacture of claim 77, wherein the self-expanding data package is written in extensible markup language (XML).

85. The article of manufacture of claim 77, wherein one or more calculations are selected through a graphical user interface.

86. The article of manufacture of claim 77, wherein the self-expanding data package is received from across a network.

87. The article of manufacture of claim 77, wherein one or more calculations comprise one or more filters that limit results displayed from the expanded table rows.

88. The article of manufacture of claim 77, wherein an editor provides an ability to directly edit the self-expanding data package.

89. The article of manufacture of claim 77, wherein logic for expanding the data package into the expanded table is fully defined within the data package and the data.

* * * * *